US008912453B2

(12) United States Patent
Hashimoto et al.

(10) Patent No.: US 8,912,453 B2
(45) Date of Patent: Dec. 16, 2014

(54) ELECTRONIC COMPONENT PACKAGE

(75) Inventors: Minoru Hashimoto, Tokyo (JP); Yoichi Kitamura, Tokyo (JP); Yosuke Kondo, Tokyo (JP); Kenichiro Ichikawa, Kanagawa (JP)

(73) Assignee: Mitsubishi Electric Corporation, Tokyo (JP)

( * ) Notice: Subject to any disclaimer, the term of this patent is extended or adjusted under 35 U.S.C. 154(b) by 108 days.

(21) Appl. No.: 13/511,383

(22) PCT Filed: Dec. 13, 2010

(86) PCT No.: PCT/JP2010/072391
§ 371 (c)(1),
(2), (4) Date: May 23, 2012

(87) PCT Pub. No.: WO2011/074541
PCT Pub. Date: Jun. 23, 2011

(65) Prior Publication Data
US 2012/0273264 A1     Nov. 1, 2012

(30) Foreign Application Priority Data
Dec. 18, 2009   (JP) .................. 2009-287997

(51) Int. Cl.
*H05K 1/16*    (2006.01)
*H01L 23/552*  (2006.01)
*H01L 23/00*   (2006.01)
*H01L 23/053*  (2006.01)

(52) U.S. Cl.
CPC ............ *H01L 23/053* (2013.01); *H01L 23/552* (2013.01); *H01L 2224/73265* (2013.01); *H01L 2224/32225* (2013.01); *H01L 2924/16251* (2013.01); *H01L 23/564* (2013.01); *H01L 2224/45144* (2013.01); *H01L 2224/48227* (2013.01); *H01L 2924/01079* (2013.01)
USPC .......................................... 174/260; 361/818

(58) Field of Classification Search
CPC ... H01L 23/053; H01L 23/552; H01L 23/564; H01L 2924/16251; H01L 2224/73265; H01L 2224/48227; H01L 2224/32225; H01L 2224/45144; H01L 2924/01079; H01L 2924/00012; H01L 2224/45; H05K 2201/10371; H05K 1/0218; H05K 2201/10674; H05K 2201/1096; H05K 1/0219
See application file for complete search history.

(56) References Cited

U.S. PATENT DOCUMENTS 5,394,011 A * 2/1995 Yamamoto et al. ............ 257/693
5,577,656 A * 11/1996 Temple et al. ............. 228/123.1

(Continued)

FOREIGN PATENT DOCUMENTS

JP    11 126835     5/1999
JP    2002 359426  12/2002

(Continued)

OTHER PUBLICATIONS

International Search Report Issued Jan. 11, 2011 in PCT/JP10/72391 Filed Dec. 13, 2010.

*Primary Examiner* — Ishwarbhai B Patel
(74) *Attorney, Agent, or Firm* — Oblon, Spivak, McClelland, Maier & Neustadt, L.L.P.

(57) ABSTRACT

An electronic component package includes a circuit board which has a mounting surface that does not show wettability for fluxless solder and on which a semiconductor element is mounted, a soldering pattern that shows wettability for the fluxless solder and is formed to surround an area on which the semiconductor element is mounted, a lid that has a shape such that a cavity is formed between the lid and the circuit board, a bonding surface to the soldering pattern is formed in a ring shape, and does not show wettability for the fluxless solder, a solder bonded part that is formed by heating a solder precoat formed of the fluxless solder on a bonding surface of the lid, and a ventilation hole that is formed by providing a bonding surface of the lid exposed in a discontinuous part of the solder precoat after the solder bonded part is formed.

6 Claims, 7 Drawing Sheets

(56) References Cited

U.S. PATENT DOCUMENTS

| | | |
|---|---|---|
| 6,262,477 B1 * | 7/2001 | Mahulikar et al. ............ 257/698 |
| 6,410,981 B2 * | 6/2002 | Tao ............................... 257/704 |
| 2001/0013640 A1 | 8/2001 | Tao |
| 2002/0181853 A1 | 12/2002 | Ido et al. |
| 2006/0237829 A1 * | 10/2006 | Hosomi ........................ 257/678 |

FOREIGN PATENT DOCUMENTS

| | | |
|---|---|---|
| JP | 2005 123236 | 5/2005 |
| JP | 2006 310859 | 11/2006 |
| JP | 2009 88338 | 4/2009 |
| JP | 2009 302248 | 12/2009 |

* cited by examiner

ELECTRONIC COMPONENT PACKAGE

FIELD

The present invention relates to an electronic component package.

BACKGROUND

It is necessary that high-frequency devices used for communication apparatuses, satellites, and radars have high reliability. Along with the expansion of applicable products, cost reduction of these devices has also been an important factor.

Because a semiconductor element used in high-frequency devices is generally sensitive to humidity, when it is used in a high temperature and humid condition, water enters into the semiconductor element and thus a component thereof is damaged and characteristics of the semiconductor element are degraded. Accordingly, a measure for preventing entering of water is usually taken by accommodating the semiconductor element in an air-tight package. Not only a semiconductor element but also electronic components such as a resistance element and a condenser may be also accommodated therein. Hereinafter, a package that accommodates therein electronic components such as a semiconductor element, a resistance element, and a condenser is referred to as "electronic component package".

However, ensuring airtightness of an electronic component package leads to an increase in the cost of components and manufacturing thereof and to an increase in the burden of quality management, which hinders cost reduction.

In recent years, a method of forming a protective film (a nitride film) on a surface of a high-frequency semiconductor element to improve its humidity resistance has been used. However, in this method, although an air-tight structure of a package becomes unnecessary by forming a protective film, high-frequency characteristics are degraded because the protective film is added. Accordingly, the thickness of the protective film has to be within a range where influences on the characteristics of the semiconductor element are permitted. As a result, a barrier effect good enough to resist to water adhesion caused by dew condensation cannot be expected, and thus a ventilation hole for preventing dew condensation is required in the package.

Furthermore, the electronic component package for a high-frequency device functions to block leakage of electromagnetic waves to outside and interference of electromagnetic waves from outside. Accordingly, the package needs to have an electromagnetic shielding structure with a metallic or conductive surface. The ventilation hole provided in the package has to be reduced to a size which electromagnetic waves cannot pass through (in a case of a 77-GHz millimeter-wave band, a permitted hole diameter is about 1 millimeter or less).

As a method of forming the ventilation hole, providing a through hole having a size needed for a shielding component (a lid) of the package is the easiest method; however, this hole becomes a path from which dust enters and thus the size of the hole needs to be reduced as much as possible. To obtain a hole diameter that has no problem even when dust enters through the hole and adheres to a wiring pattern within the package, the hole needs to be downsized to about 0.1 millimeter. However, because the hole making process becomes difficult, this is not an effective method.

Therefore, there is another method of providing an unbonded part in a bonding layer between a circuit board and a shielding component. Patent Literature 1 discloses a configuration in which, in a structure of bonding by a conductive adhesive, an adhesion layer is provided with an area where the conductive adhesive is not applied so as to form a ventilation hole (an unbonded part) and then ventilation is carried out. According to the invention of Patent Literature 1, by making the bonding layer thin in an order of several tens of micrometers, entering of dust can be prevented.

CITATION LIST

Patent Literature

Patent Literature 1: Japanese Patent Application Laid-open No. 2002-359426

SUMMARY

Technical Problem

However, when a conductive adhesive is used, because it is not possible to control wet-spreading after bonding, the shape of the ventilation hole is hardly stabilized, a wiring pattern and an electric component cannot be placed near an adhered part, and downsizing of the package is hindered. Furthermore, there is another problem that the conductive adhesive used for bonding a circuit board to a shielding component is expensive. Accordingly, the invention disclosed in Patent Literature 1 is difficult to be applied to inexpensive and downsized electronic component packages.

It is conceivable that a circuit board is bonded to a shielding component by using solder with which a bonding range can be controlled and which is an inexpensive bonding material. However, when a residue of flux remains within a package, a semiconductor element and electronic components may be corroded, and thus solder not containing any flux needs to be used. As a result, gold that has wettability for solder not containing flux needs to be plated to a bonded part of a lid and thus the component price of the lid becomes expensive.

The present invention has been achieved in view of the above problems, and an object of the present invention is to provide an electronic component package that includes a ventilation hole for preventing dew condensation within a package, can be downsized, has an electromagnetic shielding function, and can be formed at a low cost.

Solution to Problem

An electronic component package according to an aspect of the present invention having a cavity for accommodating an electronic component includes: a circuit board which has a mounting surface that does not show wettability for fluxless solder not containing flux and on which the electronic component is mounted; a ring-shaped bonding pattern that shows wettability for the fluxless solder and is formed on the mounting surface so as to surround a mounting area on which the electronic component is mounted; a lid that has a shape such that the cavity is formed between the lid and the circuit board, a bonding surface thereof to the bonding pattern being formed in a ring shape, and does not exhibit wettability for the fluxless solder; a solder layer that is formed by heating a solder precoat, which is formed of the fluxless solder on a bonding surface of the lid so that a discontinuous part where a bonding surface of the lid is exposed is formed and parts other than the discontinuous part are continuous, and that bonds the bonding pattern to a bonding surface of the lid; and a ventilation hole that is formed by providing a bonding surface of the lid exposed in a discontinuous part of the solder precoat remaining unwet with the fluxless solder and exposed even after the solder layer is formed.

Advantageous Effects of Invention

According to the present invention, because the lid does not need to be gold-plated and thus cost reduction of components is possible, an electronic component package that has a structure of having a function of shielding electromagnetic waves from an electronic component and also a function of preventing dew condensation within the package can be realized at a low cost.

DESCRIPTION OF EMBODIMENTS

Exemplary embodiments of an electronic component package according to the present invention will be explained below in detail with reference to the accompanying drawings. The present invention is not limited to the embodiments.

First Embodiment

Figure 1A:
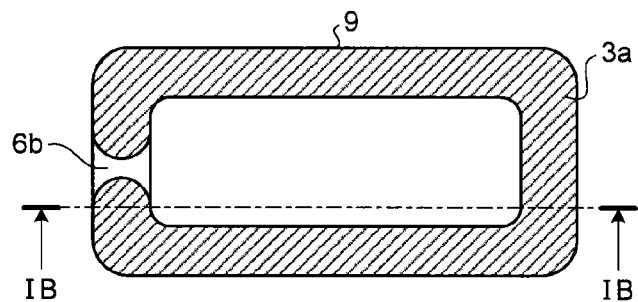
FIG. 1A is a bottom view of a lid on which nickel is plated and a solder precoat is provided.

FIGS. 1A to 3C depict a configuration of an electronic component package according to a first embodiment of the present invention. FIGS. 1A and 1B depict a state of providing a solder precoat 3a on a nickel-plated lid 9. FIG. 1A is a bottom view of the lid 9, and FIG. 1B is a cross-sectional view along IB-IB in FIG. 1A. By controlling a position where solder is supplied, the solder precoat 3a is not a continuous ring-shape but discontinuous, and an opening 6b is provided therein. The solder precoat 3a is formed of solder not containing any flux (fluxless solder). To form the solder precoat 3a by the solder not containing any flux, a solder paste containing a flux is arranged in a shape of the solder precoat 3a and then it is melted, so that the flux with a low specific gravity is separated from the melted solder. The separated flux is then removed.

Figure 2A:
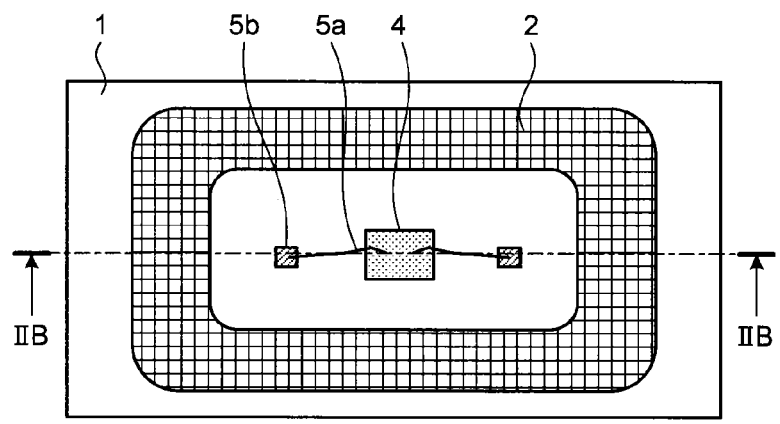
FIG. 2A is a top view of a circuit board having a semiconductor element incorporated therein, where the semiconductor element is connected to a wire connecting pad by a gold wire.
Figure 2B:
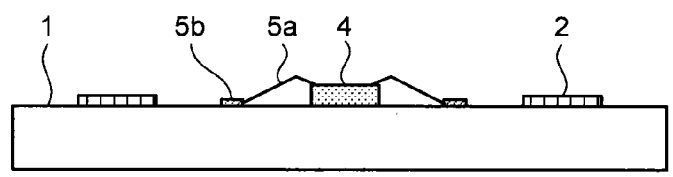
FIG. 2B is a cross-sectional view of the circuit board having the semiconductor element incorporated therein, where the semiconductor element is connected to the wire connecting pad by the gold wire.

FIGS. 2A and 2B depict a state where a semiconductor element 4 serving as an electronic component is incorporated in a circuit board 1, and the semiconductor element 4 is connected to a wire connecting pad 5b by a gold wire 5a. FIG. 2A is a top view of the circuit board 1, and FIG. 2B is a cross-sectional view along IIB-IIB in FIG. 2A. While ultrasonic bonding is generally used for connection of the gold wire 5a, because this is a bonding method using an effect such that members on a bonding surface diffuse by ultrasonic waves, both surfaces of the members need to be gold in view of bondability. Accordingly, the wire connecting pad 5b to which the gold wire 5a is connected needs to be gold-plated, and by a gold-plating process applied to the circuit board 1, a soldering pattern 2 (for example, a sintered body of a conductive silver paste) serving as a bonding pattern for incorporating a lid is also gold-plated at the same time. Note that the soldering pattern 2 is grounded. A solder resist is applied to a surface of the circuit board 1 on which the semiconductor element 4 is mounted other than its parts on which the wire connecting pad 5b and the soldering pattern 2 are formed so that the surface is not wet with fluxless solder.

Figure 1B:
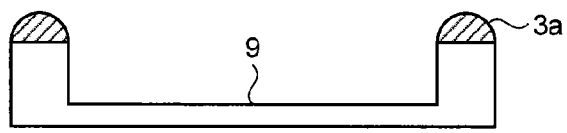
FIG. 1B is a cross-sectional view of the lid on which nickel is plated and the solder precoat is provided.
Figure 3A:
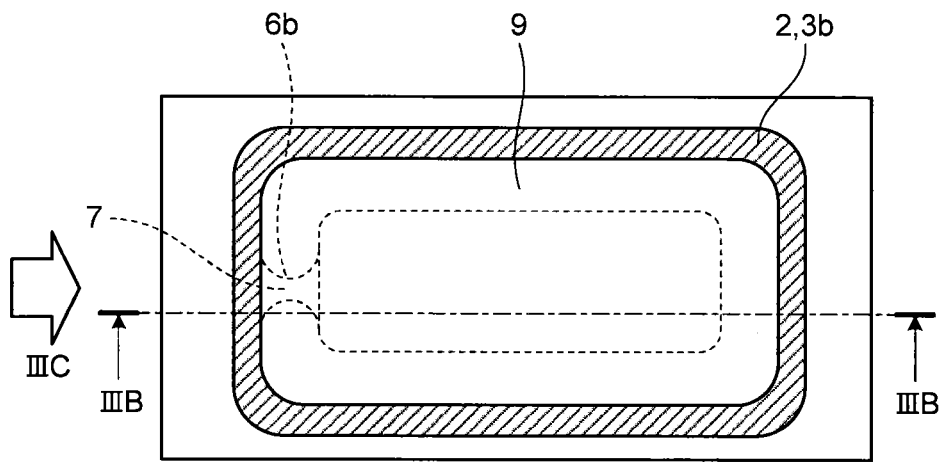
FIG. 3A is a top view of an electronic component package in which a lid is solder-bonded to a circuit board and a semiconductor element is accommodated in a cavity.
Figure 3B:
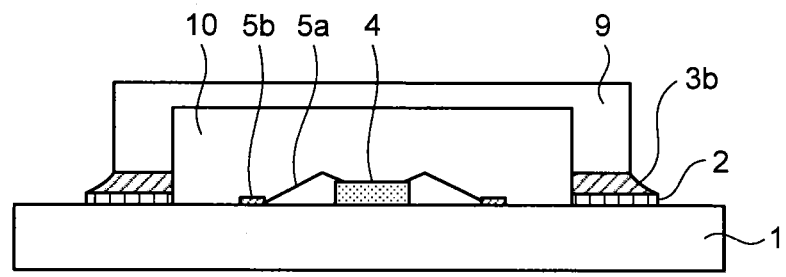
FIG. 3B is a cross-sectional view of the electronic component package in which the lid is solder-bonded to the circuit board and the semiconductor element is accommodated in the cavity.
Figure 3C:
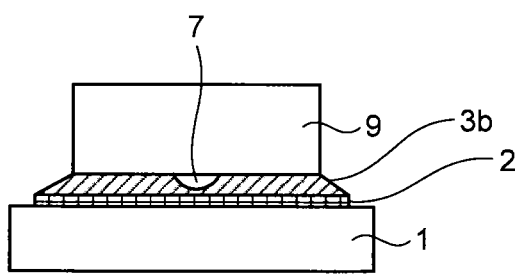
FIG. 3C is a side view of the electronic component package in which the lid is solder-bonded to the circuit board and the semiconductor element is accommodated in the cavity.

FIGS. 3A to 3C depict a state of the electronic component package in which the lid 9 shown in FIGS. 1A and 1B is solder-bonded to an assembly shown in FIGS. 2A and 2B and the semiconductor element 4 is accommodated in a cavity 10. FIG. 3A is a top view of the electronic component package, FIG. 3B is a cross-sectional view along IIIB-IIIB in FIG. 3A, and FIG. 3C is a side view as viewed from a direction of an arrow IIIC in FIG. 3A. The solder precoat 3a formed on a side of the lid 9 abuts against the soldering pattern (a gold plate) 2 formed on a side of the circuit board 1. In such a state, the solder precoat 3a is melted and the melted solder wet-spreads over the soldering pattern 2. Consequently, a bonded part 3b serving as a solder bonded layer is formed between the circuit board 1 and the nickel-plated lid 9, so that they are in a bonded state.

A surface of the nickel plate applied to the lid 9 is oxidized and an oxide film is formed thereon. Because the solder precoat 3a shown in FIGS. 1A and 1B does not contain any flux, it cannot break the oxide film on the surface of the nickel plate (that is, it cannot activate the nickel-plated surface) and does not show wettability for the nickel-plated surface. Accordingly, even when the solder precoat 3a is melted, it does not wet-spread to the side of the lid 9. Therefore, as shown in FIG. 3A, the opening 6b of the solder precoat 3a becomes a ventilation hole 7 after bonding to the circuit board 1. In other words, the opening 6b is maintained to be unwet with fluxless solder when the circuit board 1 is bonded to the lid 9, and the nickel-plated surface remains exposed, thereby forming the ventilation hole 7. Because the inside and outside of the cavity 10 communicates with each other via the ventilation hole 7, dew condensation of the semiconductor element 4 is prevented.

Restricting conditions on the dimension of the ventilation hole 7 of the electronic component package are supplementarily explained here. When the electronic component package is applied to a high-frequency apparatus, the ventilation hole 7 that functions as an air communicating portion needs to be provided without degrading the electromagnetic shielding function of the package. To this end, as it is assumed that a maximum value of the dimension of the ventilation hole 7 (a larger one of an opening width and an opening height, that is, a maximum clearance) is set as an opening dimension g, when the entire surroundings of the ventilation hole 7 is made of a conductor such as metal, the opening dimension g needs to be equal to or lower than $\lambda/4$ ($\lambda$ represents a wavelength) of a wavelength determined by a frequency used in a high-frequency circuit. This is because when the opening dimension g is equal to or lower than $\lambda/4$, it can be electromagnetically regarded as a practically continuous shielding structure, even when a clearance is physically present. By making the opening dimension g to be equal to or lower than $\lambda/4$ of the frequency used, radio waves that pass through the ventilation hole 7 can be effectively blocked. That is, an electromagnetic shielding characteristic of the electronic component package can be sufficiently ensured.

Electromagnetically, as the opening dimension g is reduced, it becomes more advantageous. That is, it is desirable that the opening dimension g is equal to or lower than $\lambda/4$ at the minimum and further reduced when a higher shielding function is needed. However, when the opening dimension g of the ventilation hole 7 is to be reduced considerably, a solder bridge (a short-circuit) is caused by wetting of solder during solder bonding and the ventilation hole 7 may not be formed and be clogged. Therefore, such a clearance capable of preventing the solder bridge needs to be ensured.

As an example, a preliminary calculation of specific numerical values of the opening dimension g described above is explained. In this trial calculation, it is assumed that a used frequency f0 is 76.5 gigahertz in a millimeter wave band. The wavelength $\lambda$ of an electromagnetic wave (=light) propagating in the air satisfies a relation of wavelength $\lambda$=light speed C/frequency f0. When the light speed $C=2.9979 \times 10^8$ [m/s] and the frequency $f0=76.5$ [GHz]$=76.5 \times 10^9$ [Hz] are substituted, the wavelength $\lambda$ is as follows. The wavelength $\lambda=(2.9979 \times 10^8)/(76.5 \times 10^9)=0.00392$ [m]$=3.92$ [mm]. In this manner, $\lambda/4=3.92/4=0.98$ [mm]=about 1 millimeter. Therefore, when the used frequency f0 is 76.5 [GHz] millimeter wave, the electromagnetic shielding function is ensured when the opening dimension g of the ventilation hole 7 is equal to or lower than 1 millimeter.

By using the above configuration, the lid 9 does not need to be gold-plated, and an electronic component package that has a structure of having an electromagnetic-wave shielding function and a function of preventing dew condensation within the package can be realized at a low cost.

Furthermore, because the ventilation hole 7 is not present at an interface with the circuit board 1, the shape and the position of the ventilation hole 7 can be easily changed.

Second Embodiment

Figure 4A:
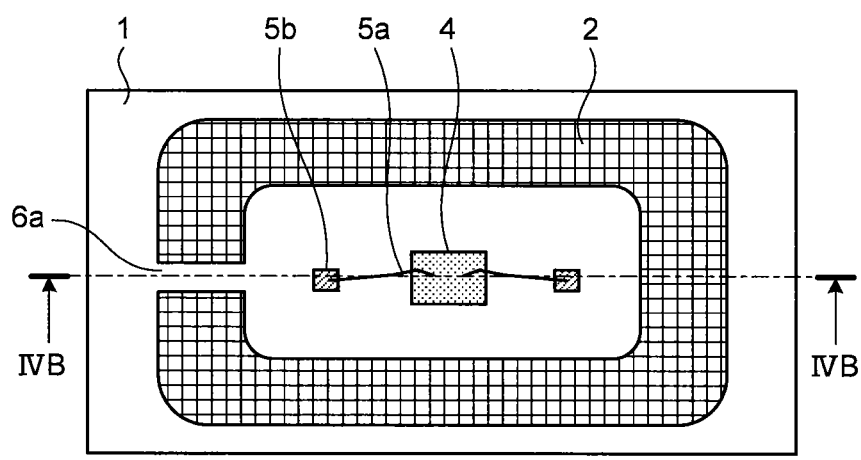
FIG. 4A is a top view of a circuit board in which a pattern opening is provided in a part of a soldering pattern for incorporating a lid.
Figure 4B:
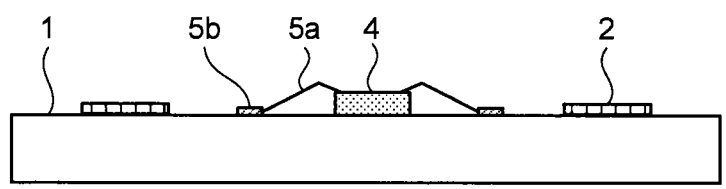
FIG. 4B is a cross-sectional view of the circuit board in which the pattern opening is provided in a part of the soldering pattern for incorporating a lid.

FIGS. 4A to 5C depict a configuration of an electronic component package according to a second embodiment of the present invention. FIGS. 4A and 4B depict a state of providing a pattern opening 6a in a part of the soldering pattern 2 of the circuit board 1 for incorporating a lid. FIG. 4A is a top view of the circuit board 1, and FIG. 4B is a cross-sectional view along IVB-IVB in FIG. 4A. The second embodiment is same as the first embodiment except that the soldering pattern 2 has the pattern opening 6a.

Figure 5A:
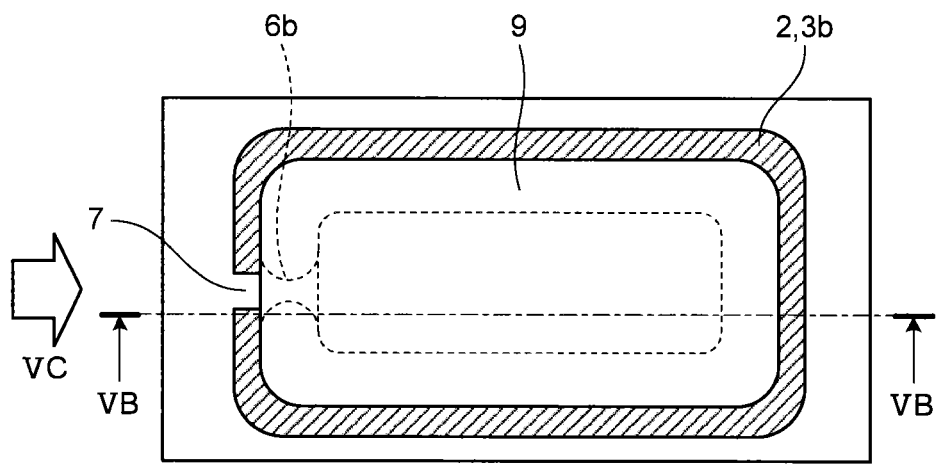
FIG. 5A is a top view of an electronic component package in which a lid is solder-bonded to a circuit board and a semiconductor element is accommodated in a cavity.
Figure 5B:
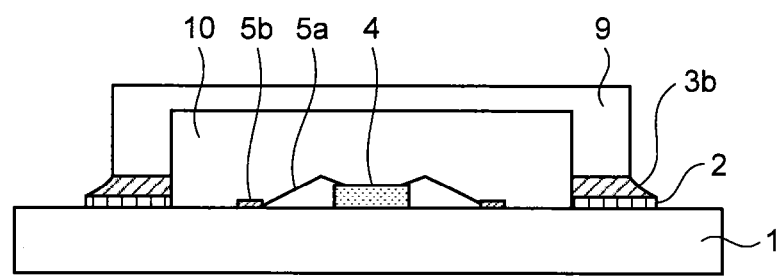
FIG. 5B is a cross-sectional view of the electronic component package in which the lid is solder-bonded to the circuit board and the semiconductor element is accommodated in the cavity.
Figure 5C:
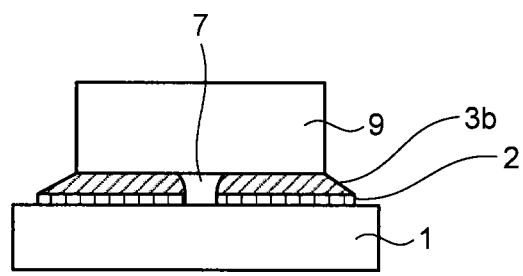
FIG. 5C is a side view of the electronic component package in which the lid is solder-bonded to the circuit board and the semiconductor element is accommodated in the cavity.

FIG. 5A is a top view of the electronic component package, FIG. 5B is a cross-sectional view along VB-VB in FIG. 5A, and FIG. 5C is a side view as viewed from a direction of an arrow VC in FIG. 5A. By bonding the lid 9 with the solder precoat 3a explained in the first embodiment (see FIGS. 1A and 1B) to the circuit board 1 with the soldering pattern 2 having the pattern opening 6a, as shown in FIGS. 5A to 5C, an electronic component package that has the ventilation hole 7 where solder is not bonded to both of the lid 9 and the circuit board 1 can be formed. In other words, the pattern opening 6a and the opening 6b are maintained to be unwet with fluxless solder when the circuit board 1 is bonded to the lid 9, and the nickel-plated surface and the surface of the circuit board 1 remain exposed, thereby forming the ventilation hole 7. Because the soldering pattern 2 is discontinuous and thus the pattern opening 6a is provided, the shielding effect in a part of the ventilation hole 7 on the side of the circuit board 1 in the configuration of the first embodiment is superior to that of the second embodiment. However, by superimposing a solder resist layer on the ring-shaped soldering pattern 2 to form the pattern opening 6a, the shielding effect in the part of the ventilation hole 7 on the side of the circuit board 1 can be the same as that of the first embodiment.

By using the above configuration, similarly to the first embodiment, the lid 9 does not need to be gold-plated, and an electronic component package that has a structure of having a function of shielding electromagnetic waves from a high-frequency circuit component and a function of preventing dew condensation within the package can be realized at a low cost.

Third Embodiment

Figure 6A:
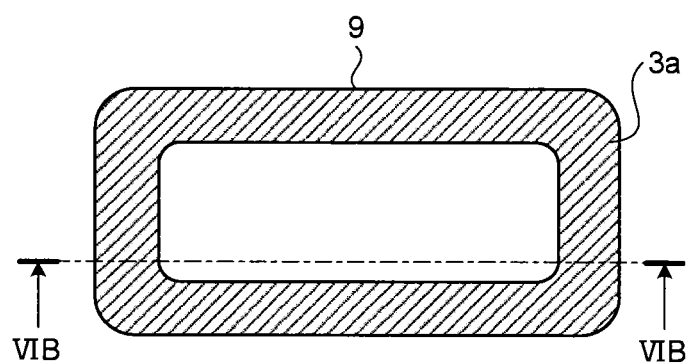
FIG. 6A is a bottom view of a lid on which nickel is plated and a solder precoat is provided.
Figure 6B:
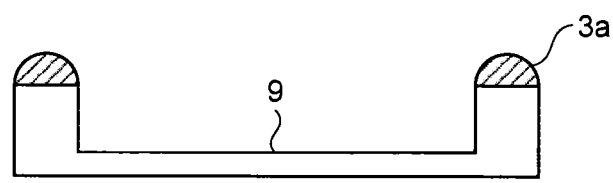
FIG. 6B is a cross-sectional view of the lid on which nickel is plated and the solder precoat is provided.
Figure 7A:
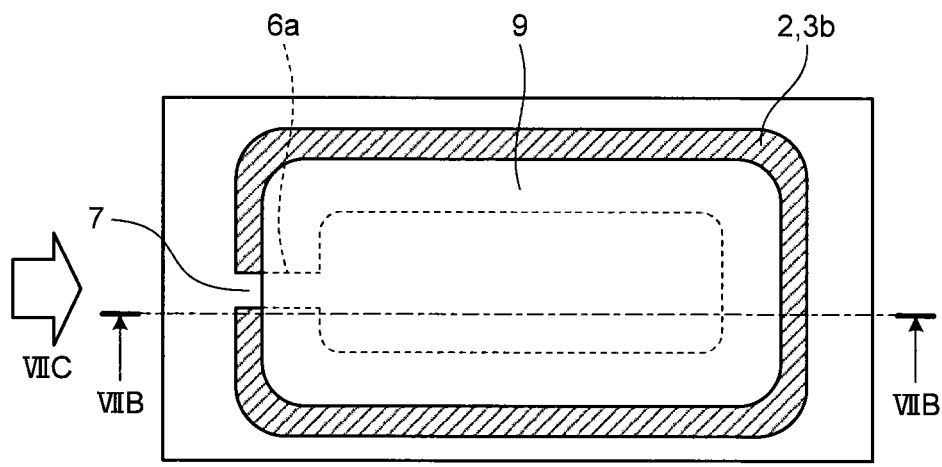
FIG. 7A is a top view of an electronic component package in which a lid is solder-bonded to a circuit board and a semiconductor element is accommodated in a cavity.
Figure 7B:
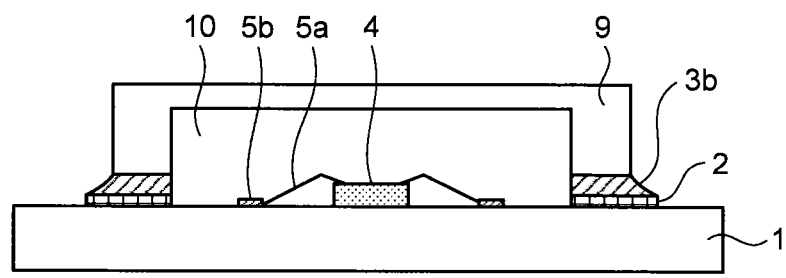
FIG. 7B is a cross-sectional view of the electronic component package in which the lid is solder-bonded to the circuit board and the semiconductor element is accommodated in the cavity.
Figure 7C:
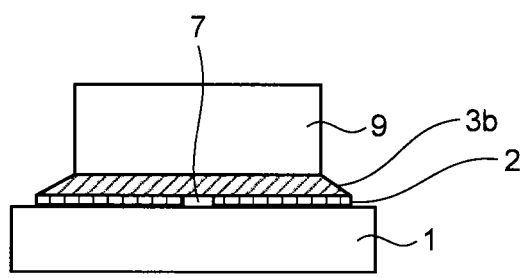
FIG. 7C is a side view of the electronic component package in which the lid is solder-bonded to the circuit board and the semiconductor element is accommodated in the cavity.

FIGS. 6A to 7C depict a configuration of an electronic component package according to a third embodiment of the present invention. FIG. 6A is a bottom view of the lid 9, and FIG. 6B is a cross-sectional view along VIB-VIB in FIG. 6A. FIG. 7A is a top view of the electronic component package, FIG. 7B is a cross-sectional view along VIIB-VIIB in FIG. 7A, and FIG. 7C is a side view as viewed from a direction of an arrow VIIC in FIG. 7A. In the present embodiment, the solder precoat 3a is formed on the lid 9 without having the opening 6b (in a closed ring shape). This lid 9 is solder-bonded to the circuit board 1 on which the soldering pattern 2 for incorporating a lid having the pattern opening 6a (see FIGS. 4A and 4B) is formed as explained in the second embodiment. As shown in FIGS. 7A to 7C, the ventilation hole 7 is formed while solder is not bonded to the side of the circuit board 1. In other words, the pattern opening 6a is maintained to be unwet with fluxless solder when the circuit board 1 is bonded to the lid 9, and the surface of the circuit board 1 remains exposed, thereby forming the ventilation hole 7. Other features of the third embodiment are same as those of the first embodiment.

By using the above configuration, similarly to the first embodiment, the lid 9 does not need to be gold-plated, and an electronic component package that has a structure of having a function of shielding electromagnetic waves from a high-frequency circuit component and a function of preventing dew condensation within the package can be realized at a low cost.

Fourth Embodiment

Figure 8A:
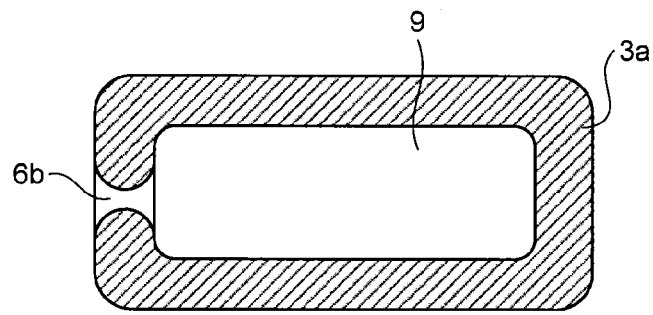
FIG. 8A is a bottom view of a lid on which nickel is plated and a solder precoat is provided.
Figure 8B:
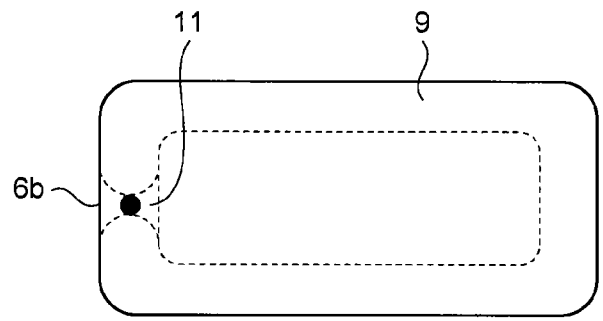
FIG. 8B is a top view of the lid on which nickel is plated and the solder precoat is provided.

FIGS. 8A and 8B depict a configuration of a lid of an electronic component package according to a fourth embodiment of the present invention. FIG. 8A is a bottom view of the lid 9, and FIG. 8B is a top view of the lid 9. An identification mark 11 that indicates a position of the opening 6b of the solder precoat 3a is formed on a top surface of the lid 9.

By providing the mark 11 on the lid 9, even when the package is in a completed state, the position of the ventilation hole 7 can be easily identified.

As for the structure of bonding the circuit board 1 and the lid 9, a structure same as those described in the first to third embodiments described above can be used. Therefore, other features of the fourth embodiment are identical to those of the first to third embodiments, and thus redundant explanations thereof will be omitted.

Fifth Embodiment

Figure 9A:
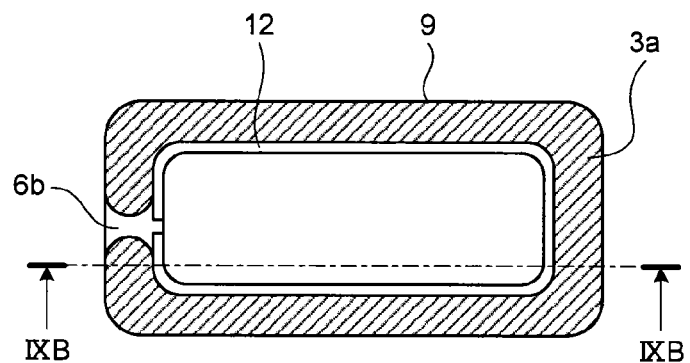
FIG. 9A is a bottom view of a lid on which nickel is plated and a solder precoat is provided.
Figure 9B:
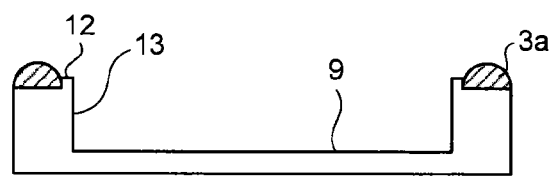
FIG. 9B is a cross-sectional view of the lid on which nickel is plated and the solder precoat is provided.

FIGS. 9A and 9B depict a configuration of a lid of an electronic component package according to a fifth embodiment of the present invention. FIG. 9A is a bottom view of the lid 9, and FIG. 9B is a cross-sectional view along IXB-IXB in FIG. 9A. A rib-shaped projecting part 12 is provided on a side surface on which the solder precoat 3a of the lid 9 is formed. The projecting part 12 prevents a melted solder paste from flowing toward a sidewall 13 of an inner circumference of the lid when the solder precoat 3a is formed.

While FIGS. 9A and 9B depict a state of providing the projecting part 12 on an inner circumferential side, a projection can be also provided on an outer circumferential side.

When the melted solder contacts the projecting part 12, the solder tends to wet-spread along a wall of the projecting part 12, and thus an effect that the wet-spreading state of the solder is stabilized can be also obtained. Accordingly, the yield of the electronic component package can be improved.

As for the structure of bonding the circuit board 1 to the lid 9, a structure identical to those described in the first to third embodiments described above can be used. Therefore, other features of the fifth embodiment are identical to those of the first to third embodiments, and thus redundant explanations thereof will be omitted.

INDUSTRIAL APPLICABILITY

As described above, the electronic component package according to the present invention is useful in a feature that an electronic component package having a function of shielding electromagnetic waves from an electronic component and a function of preventing dew condensation within the package without gold-plating a lid, and is particularly suitable as an electronic component package that accommodates therein a semiconductor element used in a high-frequency device.

REFERENCE SIGNS LIST

1 CIRCUIT BOARD
2 SOLDERING PATTERN
3a SOLDER PRECOAT
3b BONDED PART
4 SEMICONDUCTOR ELEMENT
5a GOLD WIRE
5b WIRE CONNECTING PAD
6a PATTERN OPENING
6b OPENING
7 VENTILATION HOLE
9 LID
10 CAVITY
11 MARK
12 PROJECTING PART
13 SIDEWALL

The invention claimed is:

1. An electronic component package having a cavity for accommodating an electronic component, the electronic component package comprising:
   a circuit board which has a mounting surface, on which the electronic component is mounted;
   a ring-shaped bonding pattern that is formed on the circuit board so as to surround the mounting surface;
   a lid that has a shape such that the cavity is formed between the lid and the circuit board, the lid having a bonding surface formed in a same ring shape as the bonding pattern;
   a solder pre-coat that bonds the bonding surface of the lid to the bonding pattern, wherein
   the ring-shaped bonding pattern shows wettability for fluxless solder, the bonding surface of the lid does not show wettability for fluxless solder,
   ring-shaped flux solder is formed on the bonding surface of the lid and has at least one discontinuous part,
   the solder pre-coat is formed to be a fluxless solder layer by heating the ring-shaped flux solder and removing flux therefrom, and
   the bonding surface of the lid is bonded to the ring-shaped bonding pattern via the solder pre-coat and a ventilation hole is formed at the at least one discontinuous part.

2. The electronic component package according to claim 1, wherein a bonding surface of the lid is a nickel-plated film and a surface of the bonding pattern is a gold-plated film.

3. The electronic component package according to claim 1, wherein a mark that indicates a position of the ventilation hole is provided on the lid.

4. The electronic component package according to claim 1, wherein the lid includes a rib-shaped protruding part that abuts against the bonding pattern so as to surround the mounting surface adjacent to a bonding surface of the lid.

5. An electronic component package having a cavity for accommodating an electronic component, the electronic component package comprising:
   a circuit board which has a mounting surface, on which the electronic component is mounted;
   a bonding pattern that has a discontinuous part where the mounting surface is exposed, and is formed on the circuit board so that parts other than the discontinuous part continuously surround the mounting surface;

a lid that has a shape such that the cavity is formed between the lid and the circuit board, the lid having a bonding surface formed in a same ring shape as the bonding pattern;

a solder pre-coat that bonds the bonding surface of the lid to the top bonding pattern, wherein, the bonding pattern shows wettability for fluxless solder, the bonding surface of the lid does not show wettability for fluxless solder, ring-shaped flux solder is formed on the bonding surface of the lid and has at least one discontinuous part, the solder pre-coat is formed to be a fluxless solder layer by heating the ring-shaped flux solder and removing flux therefrom, and the bonding surface of the lid is bonded to the bonding pattern via the solder pre-coat and a ventilation hole is formed at the at least one discontinuous part.

6. An electronic component package having a cavity for accommodating an electronic component, the electronic component package comprising:

a circuit board which has a mounting surface, on which the electronic component is mounted;

a bonding pattern that has a discontinuous part where the mounting surface is exposed, and is formed on the circuit board so that parts other than the discontinuous part continuously surround the mounting surface;

a lid that has a shape such that the cavity is formed between the lid and the circuit board, the lid having a bonding surface formed in a same ring shape as the bonding pattern;

a solder pre-coat that bonds the bonding surface of the lid to the bonding pattern, wherein the bonding pattern shows wettability for fluxless solder, the bonding surface of the lid does not show wettability for fluxless solder, ring-shaped flux solder is formed on the bonding surface of the lid and has at least one discontinuous part, the solder pre-coat is formed to be a fluxless solder layer by heating the ring-shaped flux solder and removing flux therefrom, and the bonding surface of the lid is bonded to the bonding pattern via the solder pre-coat and a ventilation hole is formed at the at least one discontinuous part.

\* \* \* \* \*